United States Patent [19]

Haskell

[11] Patent Number: 4,818,714
[45] Date of Patent: Apr. 4, 1989

[54] METHOD OF MAKING A HIGH PERFORMANCE MOS DEVICE HAVING LDD REGIONS WITH GRADED JUNCTIONS

[75] Inventor: Jacob D. Haskell, Palo Alto, Calif.

[73] Assignee: Advanced Micro Devices, Inc., Sunnyvale, Calif.

[21] Appl. No.: 127,995

[22] Filed: Dec. 2, 1987

[51] Int. Cl.$^4$ .................. H01L 21/265; H01L 21/70; H01L 27/00

[52] U.S. Cl. ..................... 437/044; 437/34; 437/57; 357/23.3; 357/44; 156/643; 156/653; 156/652; 148/DIG. 131; 148/DIG. 106

[58] Field of Search ............... 156/643, 650, 652, 653; 437/30, 34, 41, 44, 56, 57, 154, 235, 238, 241, 233; 357/23.3, 59 G, 44, 23.4, 23.9, 23.11; 148/DIG. 122, DIG. 131, DIG. 106

[56] References Cited

U.S. PATENT DOCUMENTS

| | | | |
|---|---|---|---|
| 3,996,657 | 12/1976 | Simko et al. | 437/43 |
| 3,997,367 | 12/1976 | Yau | 437/41 |
| 4,109,371 | 8/1978 | Shibata et al. | 437/41 |
| 4,160,683 | 7/1979 | Roche | 437/165 |
| 4,198,250 | 4/1980 | Jecmen | 437/44 |
| 4,204,894 | 5/1980 | Komeda et al. | 437/161 |
| 4,209,349 | 6/1980 | Ho et al. | 437/44 |
| 4,209,350 | 6/1980 | Ho et al. | 437/55 |
| 4,234,362 | 11/1980 | Riseman | 437/158 |
| 4,256,514 | 3/1981 | Pogge | 437/36 |
| 4,354,896 | 10/1982 | Hunter et al. | 437/186 |
| 4,356,623 | 11/1982 | Hunter | 437/44 |
| 4,366,613 | 1/1983 | Ogura et al. | 437/30 |
| 4,516,316 | 5/1985 | Haskell | 437/34 |
| 4,728,617 | 3/1988 | Woo et al. | 437/44 |
| 4,729,001 | 3/1988 | Haskell | 357/23.3 |

FOREIGN PATENT DOCUMENTS

| 0218408 | 4/1987 | European Pat. Off. | 437/44 |
|---|---|---|---|
| 0241267 | 11/1985 | Japan | 156/643 |

OTHER PUBLICATIONS

Barnes, John J. et al., "Short-Channel MOSFET's in the Punchthrough Current Mode", IEEE Transactions on Electron Devices, vol. ED-26, No. 4, Apr. 1979, pp. 446-453.

Bassous, E. et al., "Self-Aligned Polysilicon Gate MOSFET's with Tailored Source and Drain Profiles", IBM Technical Disclosure Bulletin, vol. 22, No. 11, Apr. 1980, pp. 5146-5147.

Dennard, Robert H. et al., "Design of Ion-Implanted MOSFET's with Very Small Physical Dimensions", IEEE Journal of Solid-State Circuits, vol. SC-9, No. 5, Oct. 1974, pp. 256-268.

Gaensslen, F. H. "Geometry Effects of Small MOSFET Devices", IBM Journal of Research and Development, vol. 23, No. 6, Nov. 1979, pp. 682-688.

(List continued on next page.)

[57] ABSTRACT

An MOS structure and a method for making same, including the formation of el-shaped shielding members used to form one or more lightly doped drain regions to avoid short channel and punch-through problems is disclosed which comprises forming a shielding layer of an insulating material over a gate electrode on a substrate; forming another layer of a dissimilar material over the shielding layer; anisotropically etching the layer of dissimilar material to form spacer portions adjacent the sidewalls of the gate electrode; removing the portions of the shielding layer not masked by the spacer portions, leaving one or more el-shaped shielding members; removing the spacer portions; N+ or P+ implanting the substrate at a sufficiently low energy to prevent penetration of the dopant through the el-shaped shielding member to form a highly doped source/drain region in the substrate not shielded by the el-shaped shielding member or the gate electrode; N− or P− implanting the substrate at a sufficiently high energy to penetrate through the el-shaped shielding member to form a lightly doped source/drain region in the portion of the substrate adjacent the P+ or N+ source/drain regions and separating the channel region of the substrate beneath the gate electrode from the P+ or N+ source/drain region.

20 Claims, 8 Drawing Sheets

OTHER PUBLICATIONS

Ogura, Seiki, et al., "Design and Characteristics of the Lightly Doped Drain-Source (LDD) Insulated Gate Field-Effect Transistor", *IEEE Transactions on Electron Devices*, vol. ED-27, No. 8, Aug. 1980, pp. 1359–1367.

Ohta Kuniichi et al., "A Quadruply Self-Aligned MOS (QSA MOS) A New Short Channel High Speed High Density MOSFET for VLSI", *IEDM*, 1986, pp. 581–584.

Parrillo, L. C. et al., "A Versatile, High-Performance, Double-Level-Poly Double-Level-Metal, 1.2-Micron CMOS Technology", IEDM, 1986, pp. 244–247.

Pfiester, James R., "LDD MOSFET's Using Disposable Sidewall Spacer Technology", *IEEE Electron Device Letters*, vol. 9, No. 4, Apr. 1988, pp. 189–192.

Troutman, Ronald R., "VLSI Limitations from Drain-Induced Barrier Lowering", *IEEE Transactions on Electron Devices*, vol. ED-26, No. 4, Apr. 1979, pp. 461–469.

Tsang, Paul J. et al., "Fabrication of High-Performance LDDFET's with Oxide Sidewall-Spacer Technology", IEEE Transactions on Electron Devices, vol. ED-29, No. 4, Apr. 1982, pp. 590–596.

Wang, Paul P., "Double Boron Implant Short-Channel MOSFET", *IEEE Transactions on Electron Devices*, vol. ED-24, No. 3, pp. 196–204.

Ghandhi, *VLSI Fabrication Principles*, John Wiley and Sons, Inc., 1983, pp. 424–427.

*Primary Examiner*—Brian E. Hearn
*Assistant Examiner*—M. Wilczewski
*Attorney, Agent, or Firm*—John P. Taylor

METHOD OF MAKING A HIGH PERFORMANCE MOS DEVICE HAVING LDD REGIONS WITH GRADED JUNCTIONS

BACKGROUND OF THE INVENTION

1. Field of the Invention

This invention relates to MOS devices having LDD regions with graded junctions and methods of making same.

2. Description of the Related Art

In the continuing design of VLSI devices or chips with an ever increasing number of transistors and associated circuitry formed on the same amount of space, shrinkage or sizing down of each component has created further problems which must be dealt with in the construction of the VLSI chip. The shrinkage in size of MOS transistors results in a shorter channel length and this has created problems with respect to the electric field created near the drain region which can cause short channel effects or punchthrough in which the current begins to flow in uncontrolled form through the substrate beneath the channel.

To remedy this short channel or punch through effect, it has been proposed to grade the doping or impurities in the substrate by forming a lightly doped drain region (LDD) adjacent the channel with a more heavily and deeper doped drain region, in turn, formed adjacent the LDD region. The reduced or spread out fields of the lightly doped drain structure mitigates short-channel effects, reduce hot-carrier generation, and increase the junction breakdown voltage.

The problems of lower junction breakdown voltage and hot electron injection due to the sharp impurity profile of the drain junction and the proposed remedy of forming a lightly doped drain region were first discussed by Bassous et al in an article entitled "Self-Aligned Polysilicon Gate MOSFETs with Tailored Source and Drain Profiles" which appeared in IBM Technical Disclosure Bulletin Vol. 22, No. 11, in April 1980. Bassous et al proposed thermally oxidizing a polysilicon gate and the silicon substrate followed by reactive ion etching to form an oxide sidewall on the polysilicon gate following were implanted N+ using the oxide sidewall as a shield. The oxide sidewall was then stripped followed by an N− implant to form N− or lightly doped source and drain regions in the substrate between the N+ source and drain regions and the channel beneath the gate electrode.

FIGS. 1 and 2a illustrate how such lightly doped source and drain regions (LDD regions) are typically formed in this method. Oxide spacers 14 are formed on the side of a polysilicon strip 10 which forms the gate electrode, over gate oxide 16, for several MOS transistors formed in exposed silicon portions 20 as best seen in FIG. 1. Oxide spacers 14 are formed by depositing or growing a layer of oxide (silicon dioxide) over the structure including polysilicon strip 10 and then RIE etching the structure to remove the majority of the oxide leaving only the oxide spacers 14 due to their increased thickness in the step region of the oxide layer caused by the raised polysilicon strip.

The structure may then be N+ implanted to form the N+ source and drain regions 17 shown in FIG. 2a with oxide shoulders 14 shielding the substrae region immediately adjacent the channel region to be formed under gate electrode 10. Subsequently oxide shoulders 14 are removed, thereby permitting an N− implant in the previously shielded regions of the substrate shown outlined in dotted lines at 15.

However, as shown in FIG. 2b, during the initial formation of oxide spacers 14 by RIE etching of the oxide layer, the field oxide 18 surrounding exposed silicon portions 20 may also be partially etched away as well, as shown by dotted lines 19 in field oxide layer 18, thereby giving rise to what may be severe topography problems.

Earlier, in an article entitled "A Quadruply Self-Aligned MOS (QSA MOS) A New Short Channel High Speed High Density MOSFET for VLSI" published at pp. 581–584 in IEDM in 1979, Ohta et al had proposed controlling or grading the depth of a single implant by forming a layer of oxide over a polysilicon gate electrode and then forming a nitride layer over the oxide layer which was patterned to extend laterally beyond the polysilicon gate and over a portion of the oxide layer over the substrate. The oxide layer was then reactive ion etched, using this nitride portion as a mask, resulting in horizontal portions of oxide remaining on the substrate extending laterally from the polysilicon gate electrode. A subsequent source and drain ion implant gave rise to deeper implanted regions further away from the gate electrode and more shallow implanation where the ions passed through the oxide layer resulting in shallow and deep implanted source and drain regions.

Subsequent to these publications, others have also published proposed methods of forming such lightly doped drain regions. Ogura et al, in "Design and Characteristics of the Lightly Doped Drain-Source (LDD) Insulated Gate Field-Effect Transistor", published in the IEEE Transactions on Electron Devices, Vol. ED-27, No. 8, in August of 1980, describe a method for forming such regions by first forming a column on a substrate comprising a polysilicon layer, a silicon nitride layer, and a silicon oxide layer. Using this column as a mask, the substrate is N+ implanted after which the polysilicon is overetched, undercutting the overlying nitride and oxide layers. The oxide and nitride layers are then removed and the substrate is then N− implanted to form N− regions in the substrate area beneath where the polysilicon was removed after the N+ implantation.

Tsang et al, in a paper entitled "Fabrication of High-Performance LDDFET's with Oxide Sidewall-Spacer Technology", published in the IEEE Transactions on Electron Devices, Vol. ED-29, No. 4, in April 1982, describe a method of forming LDD regions by first forming a polysilicon gate electrode, N− doping the substrate around the gate electrode, forming a silicon oxide layer over the structure which is then RIE etched to form oxide spacers on the sidewalls of the polysilicon gate electrode. Using these spacers as shields, the substrate is then N+ implanted. The original N− doping results in the formation of LDD regions between the channel under the gate electrode and the N+ regions source and drain subsequently implanted in the substrate.

Parillo et al, in an article entitled "A Versatile, High-Performance, Double-Level-Poly Double-Level-metal, 1.2-Micron CMOS Technology", IDEM, 1986, pp. 244–247, describe constructing MOS devices using a disposable polysilicon spacer which is formed on the sidewall of the gate electrode following which an N+ implant to form source and drain regions is performed.

The polysilicon spacers are then removed and an N− implant is made resulting in N− regions in the substrate adjacent to the gate electrode and separating the N+ regions from the channel formed in the substrate beneath the gate electrode.

Numerous patents have also been granted on methods of making LDD source and drain regions for MOS devices. Simko et al U.S. Pat. No. 3,996,657 teaches the formation of a double gate MOS device wherein a gate electrode which will become a floating gate is first formed over a gate oxide on a substrate layer. The substrate is then doped with N− impurities to form lightly doped source and drain regions in the substrate adjoining the substrate region under the gate and gate oxide. Another oxide layer is then formed over and around the floating gate and a second layer of polysilicon is formed over the second oxide layer. After the deposition of the second polysilicon layer, standard photo etching techniques are utilized in order to define the primary source and drain windows. After this etching step, an ordinary diffusion step is utilized to highly dope primary source and drain regions in the substrate. Because of the oxide formed on the side of the floating gate and its retention during the etching step to form the windows, the highly doped source and drain regions in the substrate under the windows are separated from the channel under the floating gate by a distance equal to the thickness of the oxide between the floating gate and the source and drain windows. Thus, lightly doped source and drain regions are formed between the channel and the highly doped primary source and drain regions in the substrate layer.

Yau U.S. Pat. No. 3,997,367 describes a method of making a transistor with an inactive base region which is separated from an emitter region by a lightly doped buffer region. A bar of photoresist is formed over a layer of silicon nitride which is, in turn formed over a passivating layer of oxide on an epitaxial silicon layer. The structure is implanted through the nitride/oxide layers to form inactive base regions following which the reist bar is trimmed in width by plasma etching or the like. The nitride layer, formerly beneath the resist but now exposed, may be optionally removed followed by implantation of the structure at a lower dosage to form the lightly doped buffer regions. The exposed nitride, if still remaining, is then removed, as well as the remaining photoresist, and the implanted areas are then oxidized. The remaining nitride formerly beneath the remaining portion of the photoresist is then removed and the active base and emitter are formed by implantation of the region formerly covered by the nitride. The patentee states that this method can be applied to IGFET devices by using an oversize resist mask to initially form the polysilicon gate and then, after implanting the source and drain, etching the resist mask and the underlying polysilicon gate to the desired final size. This is said to compensate for the expected lateral movement of the implanted source and drain.

Shibata et al U.S. Pat. No. 4,109,371 discloses a method of making an MOS device wherein the gate electrode is formed over a gate oxide layer following which source and drain auxiliary regions are implanted using the gate electrode as a mask. An oxide layer is then formed over the gate electrode and auxiliary regions. Contact holes are formed through the oxide layer and then source and drain deep junction regions are formed by diffusing or implanting the substrate through the holes.

Roche U.S. Pat. No. 4,160,683 teaches a process for making an MOS device wherein openings for source and drain contact regions are opened through an oxide layer following which the substrate is doped by diffusion through these openings to form source and drain regions. After removal of the oxide layer, a gate oxide layer is formed with openings to the source and drain regions and a metal layer is formed over the gate oxide layer. The metal layer is patterned to form source, drain, and gate contacts with spaces therebetween over the gate oxide. The underlying substrate is implanted through these spaces to form regions between the previously formed source and drain contact regions and the channel beneath the gate electrode. In another embodiment, the regions between the source and drain contact regions and the channel are doped by diffusion from layers of doped silica formed over the structure.

Jecmen U.S. Pat. No. 4,198,250 describes a process for forming an MOS device using a shadow mask to form lightly doped sources and drain regions adjacent the channel region beneath the gate electrode. An oxide layer is formed over the polysilicon layer from which the gate electrode will be formed. The oxide layer is patterned to define a portion wider than the intended gate electrode. A wet etching step is then performed on the polysilicon layer resulting in lateral etching beneath the patterned oxide to form an oxide overhang. Ion implantation of the substrate results in the formation of the source and drain regions with lightly doped extensions adjacent the channel resulting from the partial shielding of the substrate during implantation by the oxide overhang over the gate electrode.

Komeda et al U.S. Pat. No. 4,204,894 discloses a process for forming an MOS device wherein a first oxide layer formed over a gate electrode and over adjacent portion of the substrate contains dopant with a low diffusion constant. A second oxide layer is formed over the first layer and openings are formed in the two layers where source and drain contact regions are to be formed in the substrate. A third oxide layer with a high concentration of dopant is formed over the structure and in contact with the substrate through the openings. Subsequently the structure is heated and the dopants in the oxide layers diffuse into the substrate to form shallow source and drain regions under the first oxide layer and deeper source and drain regions under the third oxide layer.

Ho et al U.S. Pat. No. 4,209,349 describes a method for making a double diffusion MOS device wherein layers of nitride and oxide over a silicon substrate are patterned to define openings the source and drain regions which are formed in the underlying substrate by diffusion of P-type ions through the openings. A second insulation layer of oxide is then applied over the structure and RIE etched to form shoulders on the side edges of the patterned nitride/oxide layers which act to narrow the lateral dimensions of the source/drain openings therein. N+ ions are then diffused through these narrowed openings to form N+ regions in the substrate which extend to a lower depth than the originally formed P regions but not as wide, leaving P regions in the substrate. Source and drain contacts are then formed to the N+ regions and a gate electrode, including gate oxide, is formed over over the region of the substrate between the p regions adjacent the N+ source/drain regions.

Ho et al U.S. Pat. No. 4,209,350 teaches a method for making an MOS structure in which a silicon dioxide layer on a silicon substrate is patterned to form openings where it is desired to have source and drain regions formed in the substrate. A second layer of oxide, heavily doped with P+, is formed over the patterned first oxide layer and then RIE etched leaving shoulders or side pieces on the sidewalls of the originally formed source and drain openings in the first oxide layer. The substrate is then doped by implanting or diffusing N+ ions through the source and drain openings. During the drive-in for the ion implantation or diffusion, the P+ dopant from the second oxide layer diffuses into the substrate to form very narrow P effective channel regions in the substrate which are not as deep as the adjacent N+ source and drain regions. Gate, source, and drain electrodes are then conventionally formed.

Riseman U.S. Pat. No. 4,234,362 discloses methods for making transistor structures including MOS structures wherein a conformal insulator layer is applied over a polysilicon gate electrode and the RIE etched to form an insulating sidewall on the gate electrode. This insulating sidewall, together with an oxide layer formed over the gate electrode, electrically separates the gate electrode from a subsequently applied polysilicon layer used to form one electrode of a capacitor. The patent also illustrates the use of a conformal insulating layer to form vertical sidewalls on polysilicon strips between which openings are formed to dope the underlying substrate to form emitter and collector reach-through regions therein.

Pogge U.S. Pat. No. 4,256,514 describes a method of making a narrow dimension region on a silicon body wherein regions are formed on the silicon body having substantially horizontal surfaces and substantially vertical surfaces, i.e., a groove formed in the silicon body. A layer is then formed over this structure and the horizontal portions removed by reactive ion etching leaving only the vertical portions, i.e., on the sidewalls of the groove, defining a narrow opening to the substrate through which the substrate may be doped.

Hunter et al U.S. Pat. No. 4,354,896 teaches the formation of a submicron line width wherein a top layer of nitride is patterned and then an underlying oxide layer is etched to undercut the nitride layer. A conformal layer of polysilicon is applied which fills in the undercut portion. A dry isotropic etch is used to remove the conformal layer except for the portion filling in the undercut. The overlying nitride layer is then removed as is the remainder of the oxide layer leaving only the undercut portion of the polysilicon layer which is then used as a mask to etch underlying layers.

Hunter U.S. Pat. No. 4,356,623 discloses a method for fabricating an MOS structure wherein a gate electrode is first formed and then, either before or after an initial doping of the substrate to form source and drain regions, a conformal layer is applied and etched to form shoulders on the side of the gate electrode. Subsequent doping of the substrate at a higher energy than the first implantation forms source and drain regions adjacent the initially formed regions. The first source and drain regions are, however, masked by the conformal layer shoulders so the second implantation forms deeper regions adjoining the initially formed shallow regions. In another embodiment, the shoulder are formed prior to the first implantation and a second set of shoulders are then formed after the first implantation but prior to a second implantation.

Ogura et al U.S. Pat. No. 4,366,613 describes the formation of an MOS device wherein a gate electrode is formed over a substrate, N− source and drain regions are implanted in the substrate adjacent the electrode, an insulator layer is formed over the gate electrode and the substrate, the insulator layer is reactive ion etched to form sidewall spacers on the sides of the gate electrode, and then the substrate is N+ implanted to form N+ source and drain regions adjacent the N− regions with the N− regions separating the N+ source and drain regions from the channel formed in the substrate beneath the gate electrode.

In my prior patent, Haskell U.S. Pat. No. 4,516,316, I describe the formation of separate doped regions in a substrate by forming a first oxide layer over a substrate, a phosphorus doped polysilicon layer over the first oxide layer, a second oxide layer over the polysilicon layer, and a nitride layer. The three upper layers are patterned to expose a portion of the first oxide layer. The substrate is then doped by implantation through the first oxide layer. The three upper layers mask the remainder of the substrate. An oxide layer is then grown over the first oxide layer and the implanted substrate as well as the exposed sidewall of the polysilicon layer by steam oxidation which preferentially oxidizes the polysilicon sidewall rather than the silicon substrate due to the phosphorus dopant therein. This preferential lateral oxidation of the polysilicon sidewall undercuts the overlying oxide and nitride layers giving a large offset. The nitride, second oxide, and polysilicon layers are then removed and the substrate is again implanted with the oxide grown over the previously implanted substrate shielding it from the second implantation. In addition, the undercutting of the nitride layer by the oxide grown into the sidewall of the polysilicon layer results in a gap in the substrate between the two implanted regions. Subsequent annealing of the implanted regions causes the two doped regions to spread toward one another and optionally to touch one another.

Although many ways have thus been proposed to solve the short channel and punchthrough problem, including many ways of forming the lightly doped drain region, the use of oxide spacers has been the most widely used approach. However, as shown by comparing FIG. 2a with FIG. 2b, while the RIE etching of the oxide layer may use the underlying silicon 20 as an etch stop or end point for the etch, as in FIG. 2a, in the field oxide region between adjacent MOS devices, as shown in FIG. 2b, there is no silicon at the surface of the structure and the RIE etching will etch away grooves 19 in field oxide 18 which, if not filled, can adversely affect the topography, and, if filled, can result in the formation of voids in the filler material which can subsequently result in reliability problems from inclusion of contaminants. Also if the voids are exposed, they may etch preferentially or oxidize which can, in turn, stress the substrate.

To avoid the problem of over etching into the field oxide between adjacent devices, it has been proposed, as discussed above, for example, with regard to the Parillo et al article, to replace the prior art oxide spacers or shoulders shown in FIGS. 1 and 2a-2b with polysilicon spacers which would be formed by RIE etching a conformal polysilicon layer which would be formed over the structure (after first forming a thin oxide layer which would serve to separate the polysilicon gate strip from the conformal polysilicon layer). However, the use of a conductive material such as polysilicon to form the spacers adjacent the gate electrode necessitates the subsequent removal of such polysilicon spacers since they would be electrically floating and could cause threshold shifts.

Stripping the polysilicon spacers from the structure would, in itself, cause further problems if the quality of the oxide separating the polysilicon spacer from the polysilicon gate was not perfect since the etchant used to remove the polysilicon spacer might penetrate the oxide to attack the polysilicon gate. In addition, if there are pinholes in the oxide layer, which is formed over the polysilicon gate prior to deposition of the conformal layer of polysilicon used to form the polysilicon spacers, the two polysilicon layers may coalesce and the subsequent RIE etching to form the spacer will etch through these areas instead of stopping on the oxide layer.

Thus, there remains a need for solving the problem of short channel effects such as punchthrough in MOS transistors used in VLSI structures by constructing lightly doped drain regions without incurring the additional problems of the prior art which can occur when either oxide or polysilicon spacers are used in the course of the formation of lightly doped source and drain regions.

SUMMARY OF THE INVENTION

It is, therefore, an object of the invention to provide an improved method for forming an MOS device having a lightly doped drain region to avoid short channel and punchthrough problems.

It is a further object of the invention to form such a MOS device with a lightly doped region by forming shielding members through which a lightly doped region may be implanted in the substrate while shielding a high concentration implantation used to form a highly concentrated doped region adjacent the lightly doped region.

These and other objects of the invention will be apparent from the following description and accompanying drawings.

In accordance with the invention, a method for making an MOS structure having a lightly doped drain region to avoid short channel and punchthrough problems comprises: forming over a gate electrode on a substrate a shielding layer of an insulating material; forming another layer of a dissimilar material over the shielding layer; anisotropically etching the layer of dissimilar material over the shielding layer to remove the layer except for spacer portions over the shielding layer adjacent the sidewalls of the gate electrode; removing the portions of the shielding layer not masked by the spacer portions, leaving one or more el-shaped shielding members each having a vertical portion against the gate electrode and a horizontal leg extending over the substrate from the vertical portion; removing the spacer portion over the el-shaped shielding member; implanting the substrate with a dopant material at a sufficiently low energy to prevent penetration of the dopant through the el-shaped shielding member and a concentration high enough to form a highly doped source/drain region in the portion of the substrate not shielded by the el-shaped shielding member or the gate electrode; and implanting the substrate with a dopant material of the same type at a sufficiently high energy to penetrate through the el-shaped shielding member at a concentration low enough to form a lightly doped source/drain region in the portion of the substrate shielded by the el-shaped shielding member adjacent the channel region of the substrate beneath the gate electrode; whereby the low concentration implantation will form a lightly doped source/drain region separating the channel region of the substrate beneath the gate electrode from the highly doped source/drain region.

DETAILED DESCRIPTION OF THE INVENTION

Figure 1:
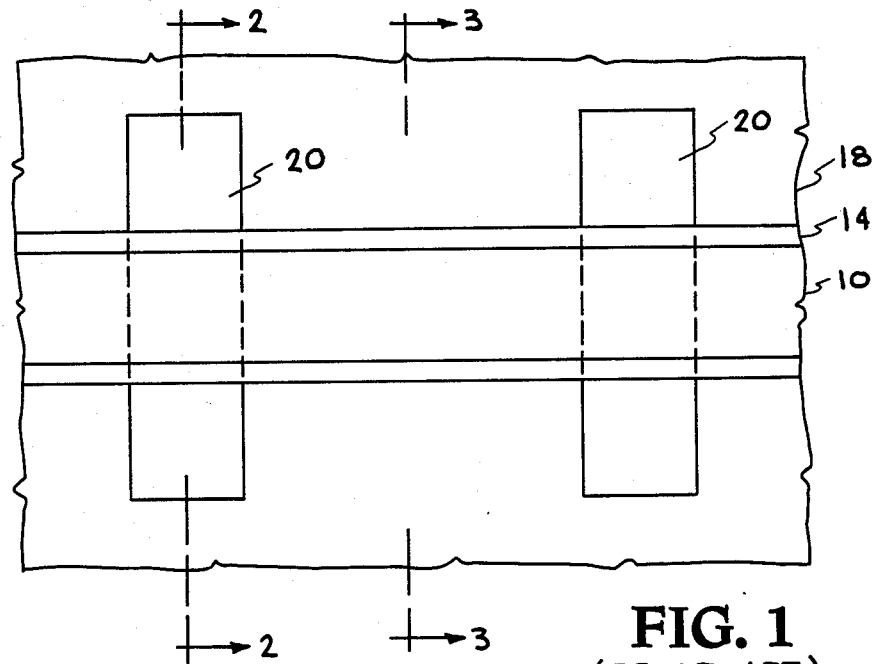
FIG. 1 is a fragmentary top view of a portion of a prior art MOS device.
Figure 2A:
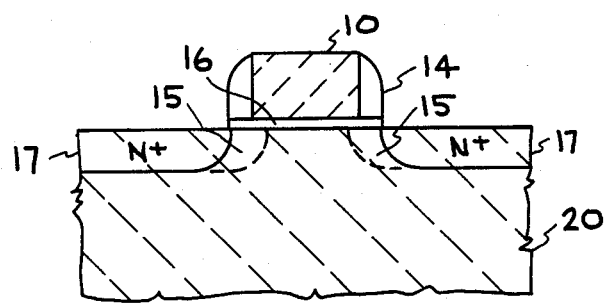
FIG. 2a is a fragmentary side section view of a portion of FIG. 1 (Prior Art).
Figure 2B:
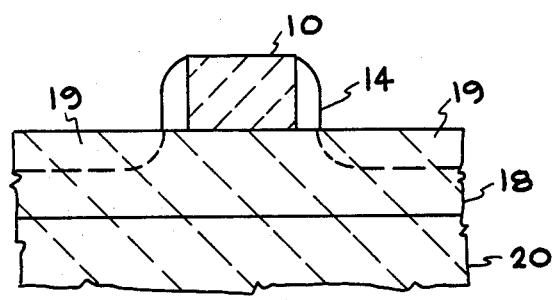
FIG. 2b is a fragmentary side section view of another portion of FIG. 1 (Prior Art).

The invention provides a MOS device having LDD regions formed without incurring the deleterious effects of using oxide or polysilicon spacers to form the desired graded doping of the source and drain regions of the device.

Referring now to FIGS. 3-11, a polysilicon gate electrode 30 is shown conventionally formed over a gate oxide layer 28 by patterning and etching a polysilicon layer using the gate oxide layer 28 as an etch stop. As shown in FIGS. 3-6, the particular gate electrode is shown for an N channel device to be formed in P well 36 in an N doped silicon substrate 40 having field oxide portions 44 to electrically separate or isolate the device from adjoining devices. As the steps process, formation of a P channel device in substrate 40 will also be illustrated, commencing with FIG. 7.

Figure 3:
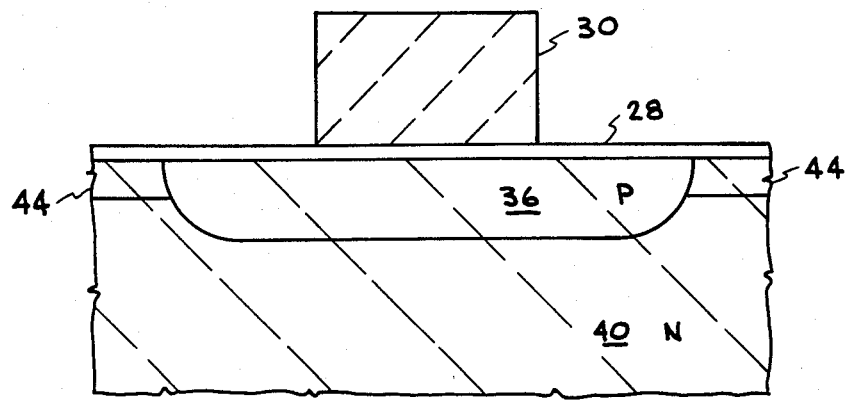
FIGS. 3-11 are fragmentary side section views of the sequential construction of the LDD regions of the MOS devices of the invention.
Figure 4:
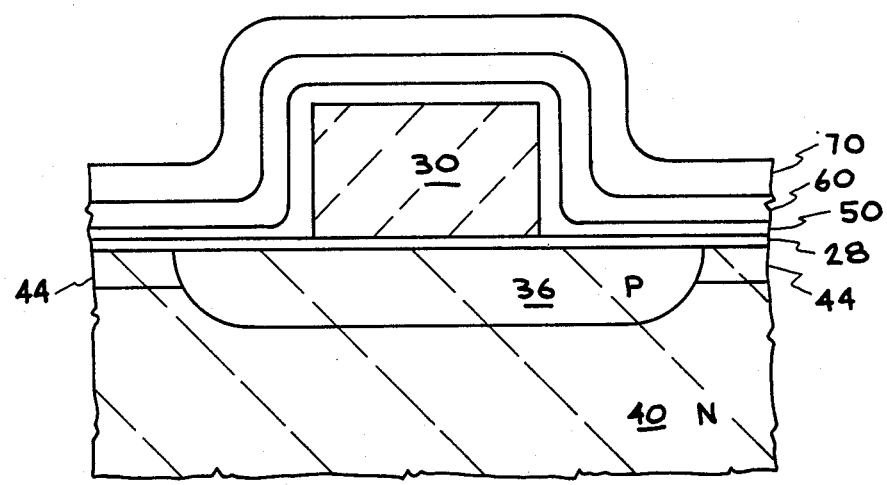

Construction of the structure through the stage shown in FIG. 3 is conventional. In accordance with the invention, however, formation of the LDD regions in the MOS devices commences with the formation of an oxide layer 50, as seen in FIG. 4, which is grown over polysilicon 30 and the gate oxide 28 on silicon 40, including P well 36. Oxide layer 50 is grown to a thickness of about 350-450 Å, preferably about 400 Å, on polysilicon gate electrode 30 and a thickness of about 200-300 Å, preferably about 250 Å, over the silicon substrate.

A layer of material 60 of about 800 to 1000 Å is then deposited over oxide layer 50 followed by deposition of conformal layer 70. The material comprising layer 60 may comprise any material which may be selectively removed, i.e, selectively etched away, without damage to the substrate, the polysilicon gate electrode, or to the spacers which will be formed from conformal layer 70 as will be described below. By way of example, and not of limitation, layer 60, and the el-shaped shielding members which will be formed therefrom, will be desribed as a silicon nitride layer having a thickness which may vary from at least about 400 to about 800 Angstroms.

Conformal layer 70 may comprise a 2200 to 2800 Å, preferably about 2500 Å, thick layer of either oxide (silicon dioxide) or polysilicon. For purposes of explaining this embodiment, it will be assumed that conformal layer 70 comprises polysilicon. The process modifications necessary for the use of an oxide conformal layer will be explained layer.

Figure 5:
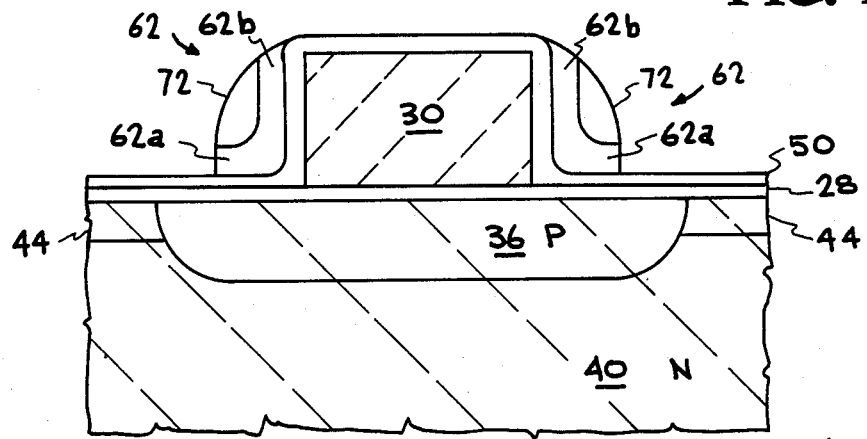

Conformal layer 70 is etched with a RIE type anisotropic etch to remove most of the conformal polysilicon layer leaving only polysilicon spacers 72 as shown in FIG. 5. It will be noted in FIG. 5 that, in the embodiment illustrated, most of the underlying silicon nitride layer 60 preferably has also been removed by the etchant, leaving only el-shaped nitride shielding member 62 adjacent to and beneath spacer 72 comprising a horizontal portion or leg 62a extending from gate electrode 30 over a portion of the substrate and oxide layers 50 and 28 thereon and a vertical portion 62b formed on the portion of oxide layer 50 on the sidewall of gate electrode 30. This step of removal of silicon nitride layer 60 as well as conformal layer 70 may be used when conformal layer 70 comprises polysilicon.

Alternatively, if desired, nitride layer 60 may be separately removed after the RIE etch of conformal layer 70 using, for example, a dry etch, or a selective wet etch such as phosphoric acid. This procedure may be employed, for example, when it is desired to initially remove only the portion of nitride layer 60 overlying the first channel region to be formed, with the remainder of the nitride layer serving as a mask over the other channel region as will be explained below with respect to an alternative embodiment of the process of the invention.

When conformal layer 70 comprises polysilicon, a chlorinated RIE etchant system, e.g., $CCl_4$ or $SiCl_4$, may be used and the underlying oxide layer 50 may be used as the etch stop. Alternatively, the same RIE etchant system may be employed, using nitride layer 60 as an etch stop, when it is desired that nitride layer 60 be removed in a separate step as described above. If conformal layer 70 comprises an oxide layer (silicon dioxide), a fluorinated/$O_2$ RIE etchant system. e.g., $CHF_3+O_2$, may be used, in which case nitride layer 60 is used as the etch stop layer.

In any case, el-shaped nitride shielding member 62 is formed using spacer 72 (whether oxide or polysilicon) as the etch mask whether conformal layer 70 and nitride layer 60 are etched in a single step or in two separate steps.

Polysilicon spacers 72 may be subsequently removed after the selective removal of nitride layer 60 leaving el-shaped nitride shielding members 62 since their sole purpose is to provide an etch mask or pattern to control the width of the horizontal leg 62a of el-shaped nitride shielding member 62. Polysilicon spacer 72 may be removed, as shown in FIG. 6, using a selective wet etchant such as KOH which is not an etchant for the underlying el-shaped nitride shielding member 62 nor the adjoining oxide layer 50 exposed by removal of the remainder of nitride layer 60.

Figure 6:
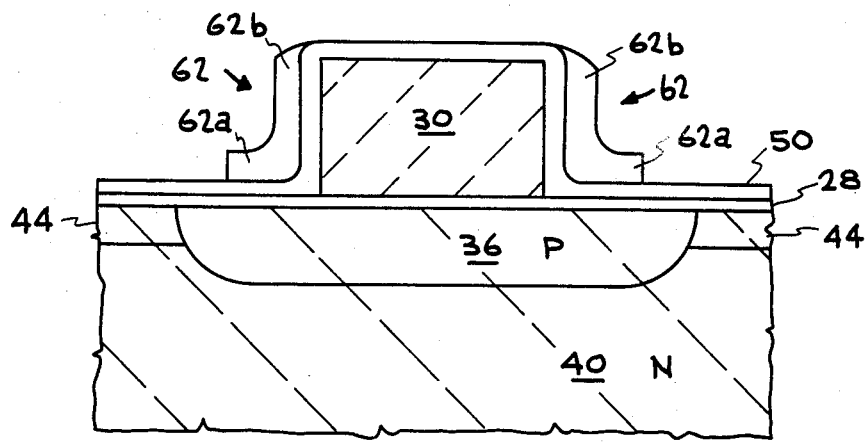

The foregoing description and accompanying drawings (FIGS. 3-6) illustrated the formation of the structure shown in FIG. 6 which may be used in forming either a P channel or N channel device.

Figure 7:
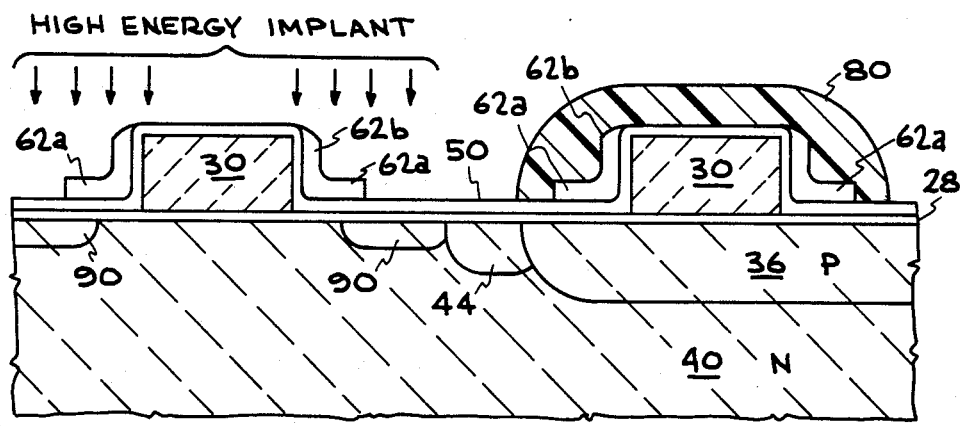
Figure 8:
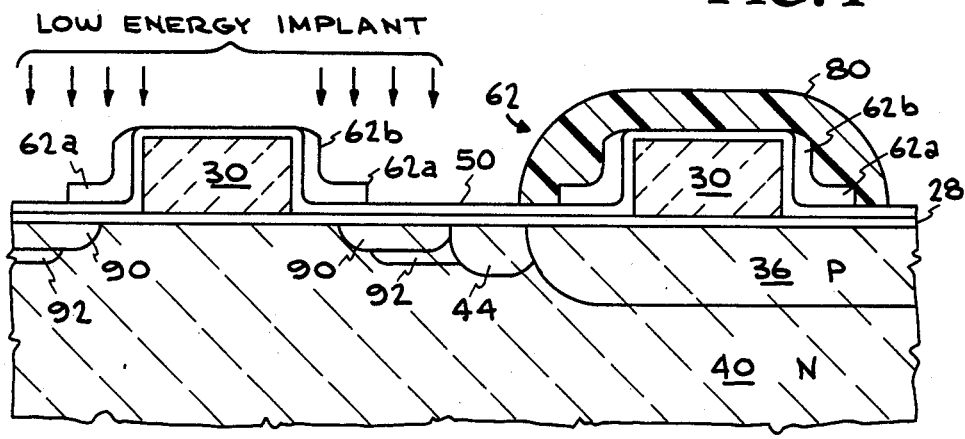

In FIGS. 7-11, the steps necessary for the construction of both N channel and P channel devices are illustrated. In the illustrated embodiment, a photoresist layer 80 is formed to mask off the N channel region while implanting the source and drain regions for the P channel device. As shown in FIG. 7, a first high energy, low concentration P- implant may be carried out using, for example, $B_{11}$ at an energy level of about 50 Kev and a concentration of about $10^{13}$ ions/cm$^2$. The high energy implant penetrates through the horizontal nitride shoulder 62a and the underlying oxide layer 50 into substrate 20 to form the lightly doped source and drain regions 90 shown in FIG. 7.

Following this, a low energy, high concentration P+ implant is made using, for example, $BF_2$, at 80-100 Kev at a concentration of from about $10^{15}$ to about $10^{16}$ ions/cm$^2$. This results in a shallower implantation of dopant (compared to the P- implantation) through the oxide layer 50 into the substrate to form heavily doped (P+) source and drain contact regions shown at 92 in FIG. 8 due to the concentration of the dopant. However, the low energy of the second doping step results in the P+ implantation not penetrating through the sandwich layer of nitride at 62a and oxide 50 resulting in a masking of the initially formed lightly doped source and drain (LDD) regions 90 formed during the high energy implantation step.

It should be noted here that the sequence of the two implantation steps is not important and the low energy implantation step may be performed first. What is important is that the portion of the substrate where the lightly doped source and drain regions have been formed (or will be formed) in substrate 40 beneath portion 62a of el-shaped nitride shielding member 62 must be shielded from the P+ implantation so that these substrate regions under nitride horizontal portion 62a will only be lightly doped.

Following the second implantation of the P channel device, mask 80 is stripped and a second mask 84 is formed over the implanted P channel device in preparation for the implantation steps to form the N channel device.

Figure 9:
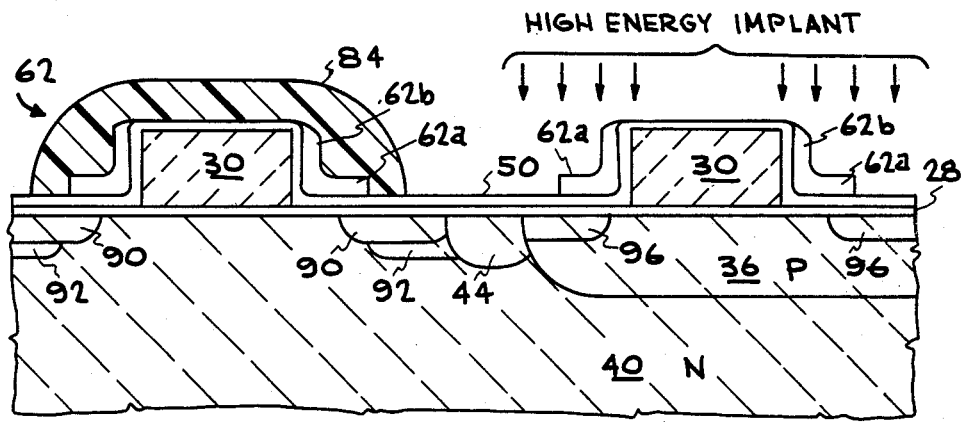

As shown in FIG. 9, a high energy low concentration N- implantation may be first carried out to form N- source and drain regions 96 using, for example, a phosphorus implantation at 150 Kev and a concentration of about $10^{13}$ ions/cm$^2$ with the high energy, but low concentration of dopant, serving to penetrate the horizontal portions 62a of el-shaped nitride shielding member 62 to form the desired lightly doped (LDD) source and drain regions 96 thereunder.

Figure 10:
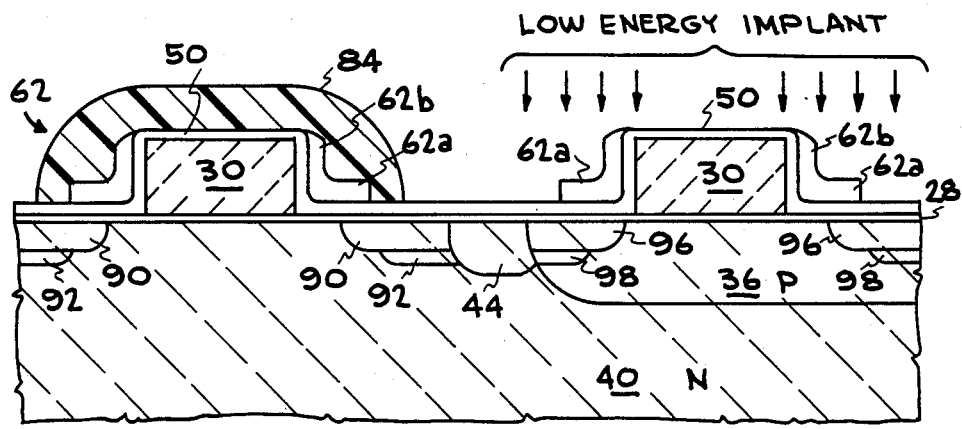

This high energy N- implantation is then followed by a low energy, high concentration N+ implantation step to form the highly doped source and drain contact regions 98 in the substrate using, for example, an arsenic implantation at an energy level of about 60 Kev with a concentration of from about $10^{15}$ to about $10^{16}$ ions/cm$^2$. As discussed previously, with respect to formation of the P channel device, the horizontal portions 62a of the el-shaped nitride shielding members 62 shield the previously formed lightly doped regions 96 thereunder from the low energy N+ implantation. The result is the formation of N+ source and drain contact regions 98, as shown in FIG. 10, separated from the N channel beneath gate 30 by lightly doped N- regions 96.

As previously discussed with respect to the implantations for the P channel device, the order of sequence of the high and low energy N implantations may be reversed if desired.

After the N+ and N- implantations to form the N channel device, resist mask 84 may be removed followed by removal of nitride shielding members 62 in the N channel region using, for example, a seletive wet etchant such as phosphric acid which will not react appreciably with the xposed polysilicon or oxide in the structure.

The resultant structure may now be annealed by heating to a temperature of from about 900 to 1000° C. for a period of from about 15 to about 30 minutes. The structure may also be annealed using a rapid thermal annealing process wherein the structure is heated to 1000° C. for about 30 seconds.

Alternatively, a further oxide layer may be either deposited, e.g., at about 750° C., or grown into which contact openings to the source, drain, and gate electrodes will be cut and the heat used during the deposit or growth of this oxide layer will also serve to anneal the implanted substrate regions.

It should also be noted that, if desired, an anneal may be conducted after implanting the first channel and prior to the processing of the second channel. This might, for example, be desirable if a dopant which diffuses slower, such as arsenic, is implanted to form the N channel first, followed by an anneal and then implantation of the P channel using a dopant such as boron which diffuses faster. Subsequent annealing would then expose the arsenic to a longer total diffusion time than the boron.

Figure 11:
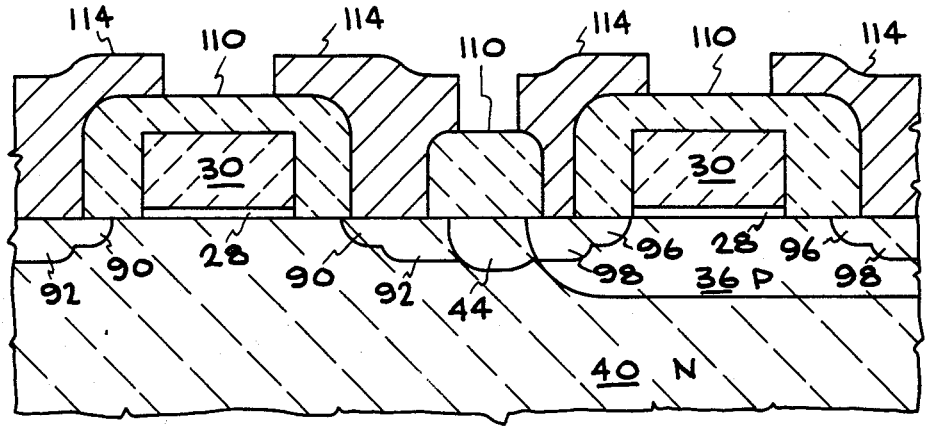

After this a conventional insulating layer of oxide may be applied over the structure and patterned to form oxide portions 110 with a metal layer then applied and patterned to form metal source and drain contacts 114 to the respective N+ and P+ source and drain contact regions resulting in the LDD MOS structure shown in FIG. 11.

The term "high energy" as used herein is intended to define an energy level sufficiently high to penetrate the thickness of the horizontal leg 62a of el-shaped nitride shielding member 62 and the underlying oxide layer 50 and to implant the dopant a minimum distance of at least about 500 Angstroms into the substrate thereunder. The absolute values will, however, depend upon the mass of the particular dopant used, the sheet resistance of the N-/P-, and the working voltage of the structure discussed.

The term "low energy", as used herein is intended to define an implantation at an energy level insufficient to penetrate through the thickness of the aforesaid horizontal leg of el-shaped nitride shielding member 62, but sufficient to penetrate into said substrate a minimum distance of at least about 600 Angstroms in those regions not shielded by said el-shaped shielding member or other masking members.

The term "high concentration" as used herein is intended to define a doping concentration of at least $10^{19}$ ions/cm$^3$, while the term "low concentration" as used herein is intended to define a doping concentration of at least $10^{17}$ ions/cm$^3$, but no more than $5 \times 10^{18}$ ions/cm$^3$.

Attention should again be called to the fact that the formation of the el-shaped nitride shielding members 62 results in the formation of a vertical portion 62b as well as the horizontal portion 62a of each member. While the horizontal portions 62a serve to shield the substrate from the respective low energy P+ and N+ implantations, resulting in only the low concentration high energy implantations penetrating to the substrate thereunder, the vertical portion of each el-shaped member 62 also serves a useful function by shielding the substrate thereunder during both the high energy and low energy implantations. The result is the formation of respective regions between the implanted P– or N– LDD regions and the channel region under gate electrode 30 and gate oxide 28 in which there is little, if any, dopant present.

As a result of this, the naturally occurring lateral diffusion of dopant during the subsequent annealing step or steps does not result in any appreciable migration of dopant into the N or P channel regions under the gate electrodes 30. This, in turn, results in a reduction in the Miller capacitance of the device, resulting in a higher performance device, e.g., raises the speed of the device.

In this regard, it should also be pointed out that the thickness of the initial nitride layer 60, from which el-shaped nitride shield member 62 is formed, will control the width of the vertical portion 62b of shield member 62 while the annealing conditions will control the amount of lateral migration of the dopant into this shielded region of the substrate. Therefore, these two parameters may be coordinated to maximize the desired reduction of Miller capacitance formed between the substrate and gate electrode 30.

It should also be noted that the two implantation steps used in forming each channel result in a vertical gradiation in the concentration of the dopant in the contact regions of the source and drain regions resulting in a reduction in the junction to substrate capacitance of the device as well which further enhances its performance.

With respect to the overall efficiency of the process and compatibility with other process conditions in the structure, it will be noted that, in the embodiment just described using polysilicon spacers 72, only two photoresist masks are necessary and the problem of overetching of the adjacent field oxide regions while removing an oxide spacer as experienced in the prior art has also been solved. Furthermore, the presence of nitride layer 60 under polysilicon layer 70 alleviates the problems incurred when using polysilicon spacers in the prior art.

Using the process and el-shaped shielding members of the invention, permits greater flexibility with respect to the choice of thickness for the oxide layer 50 which is initially formed over the gate oxide and polysilicon gate electrode. In conventional processing, the thickness of the oxide layer 50 over the source and drain regions is limited by the implant energy of the P+/N+ implementations. That is, while it might be desirable to make oxide layer thick to protect the gate edges during subsequent etch steps, this will inhibit penetration of the P+/N+ implantations. Even in the process of the invention, etching of the layer 60 to form the el-shaped shielding members can result in some etching of oxide layer 50, resulting in the nonuniformity.

However, when using the el-shaped shielding members of the invention, it is possible to form an initial thick oxide layer 50 having a thickness of about 350 to 400 Angstroms and then, after the el-shaped shielding members have been formed, to remove the remaining exposed portions of oxide layer 50. A new oxide layer can then be grown or deposited over the source and drain regions as well as over the polysilicon gate electrode after the source and drain implantations. In this manner, a thick oxide layer may be formed beneath the el-shaped shielding members to cooperate with the el-shaped shielding members in protecting the gate edges without interfering with the low energy, high concentration P+/N+ implantations.

In another embodiment of the invention, conformal layer 70 comprises an oxide layer and oxide spacers 72 are formed when RIE etching conformal layer 70. For simplicity sake, the same numerals will be used to describe conformal layer 70 as an oxide layer and spacers 72 as oxide spacers as were used for conformal polysilicon layer 70 and polysilicon spacers 72 since the geometrical configuration of the spacers will not vary with the type of material selected to form the spacers.

In this embodiment, nitride layer 60 is used as the etch stop layer and following the RIE step, nitride layer 60 is patterned, using oxide spacers 72 as a mask, to form the desired el-shaped nitride shielding members 62 with the width of horizontal nitride portion 62a governed by the width of oxide spacer 72. Removal of nitride layer 60 may be by dry etching or selective wet etching using, for example, phosphoric acid.

As in the previous embodiment using polysilicon spacers, following the formation of el-shaped nitride portions 62, oxide spacers 72 are removed using a suitable etchant such as a buffered oxide etch. After removal of oxide spacers 72, the remainder of the process in this embodiment is identical to the previously described embodiment.

It should be noted, however, that removal of the oxide spacer 72 can be a little more difficult than removal of spacer 72 when it comprises polysilicon. This is because spacer 72 functions as a mask to form the el-shaped nitride members 62 by removal of the remainder of nitride layer 60. However, this, in turn, exposes the field oxide 44 below nitride layer 60.

One solution to this is to use a low temperature or doped oxide layer 70 to form oxide spacers 72, e.g., using an oxide doped with about 10 wt. % phosphorus. This oxide will then etch at a rate of from about 20 to 200 times faster than the field oxide in a wet buffered oxide etch such as, for example, a 10:1 $H_2O$/HF etch, or any other etch which will be selective to doped oxide layer 70 in preference to the field oxide. If desired, or needed, even higher amounts of dopants may be used in oxide layer 70. For example, using the same etchant system, when a 20% doped phosphorus glass is used, the rate of etching of doped oxide layer 70 may be as high as 400–500 Angstroms/sec in comparison to the thermal (undoped) oxide etch rate of 5 Angstroms/sec.

It must be noted, in regard to the use of a doped oxide to form oxide layer 70, that the prior art use of oxide spacers did not permit the use of such a doped layer because the dopant, e.g., phosphorous, in such a doped oxide layer would diffuse into the underlying substrate. However, in the practice of this invention, the provision of the underlying layer 60, from which el-shaped shielding members 62 are formed, e.g., a nitride layer, prevents the phosphorus doping in oxide layer 70 from diffusing therethrough into the substrate.

It should also be pointed out that in either embodiment, it is possible to modify the process to only initially remove portions of the nitride layer to form the el-shaped members 62 in either the P channel or the N channel while leaving the nitride layer intact in the region of the other channel. This can be accomplished by masking the second channel region of the substrate, e.g., the N channel region, with resist to protect the nitride layer thereunder while removing the nitride layer over the substrate region where the first channel, e.g., the P channel, is to be formed.

Such a modification enables the remaining nitride layer and the polysilicon/oxide spacers thereon to serve as the mask for the other channel, e.g., the N channel, during the implantation steps to form the first channel, e.g., the P channel, thus eliminating the use of the first photoresist mask, e.g., photoresist mask 80 over the N channel region during, for example, the formation of the P channel structure. This alternate embodiment of the process is illustrated sequentially in FIGS. 12–21.

Figure 12:
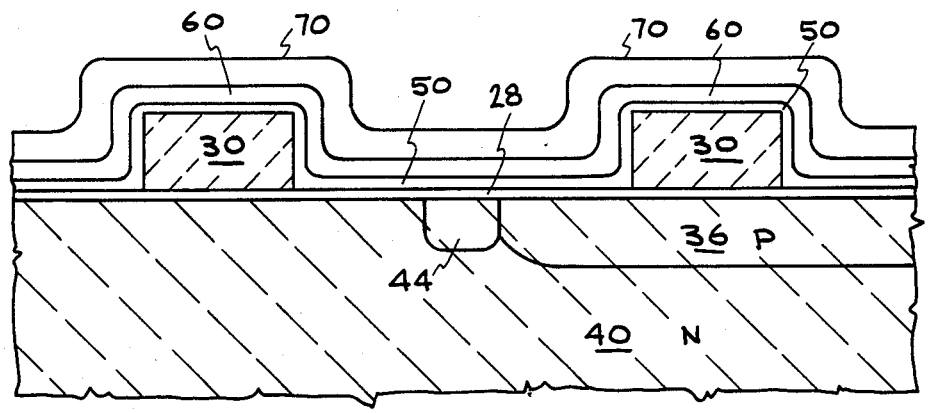
FIGS. 12-21 are sequential fragmentary side section views of an alternate embodiment which may be used in construction of the LDD regions of the MOS devices of the invention.
Figure 13:
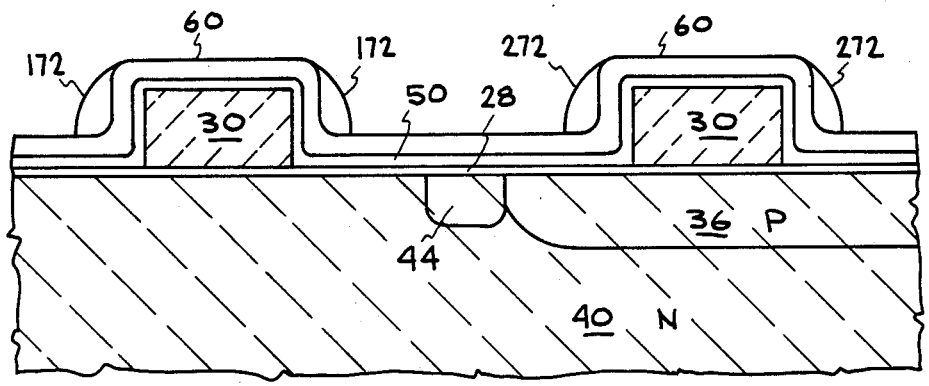

In the embodiment shown in these Figures, an oxide layer is again first formed over polysilicon gate electrodes 30 followed by a nitride layer 60 and then a conformal layer 70 of polysilicon or oxide is applied resulting in the structure of FIG. 12. Again, as in the previous embodiment, conformal layer 70 is subjected to a RIE etch stopping on nitride layer 60 to form spacers 172 and 272 respectively on the sides of the two raised polysilicon gate electrodes 30 shown in FIG. 13. Up to this point, the process is the same as shown up to and including FIG. 5 with, however, two gate electrodes shown for purposes of clarity to show where both the N and P channel regions will be formed.

Figure 14:
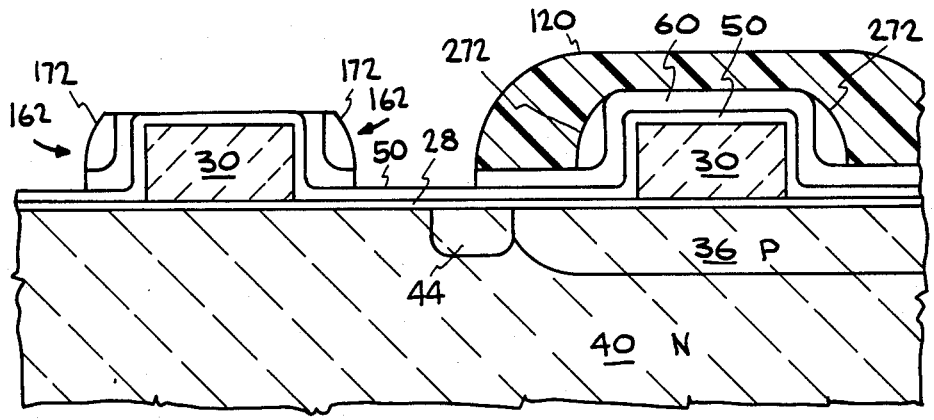

At this point, however, the region wherein the N channel will be formed is masked with a photoresist mask 120 prior to selective removal of nitride layer 60 to the form el-shaped nitride shielding members or removal of either spacers 172 or 272. After masking the N channel region, the exposed nitride in the P channel region is selectively removed using spacers 172 therein as a mask to form el-shaped nitride shielding members 162 as shown in FIG. 14.

Figure 15:
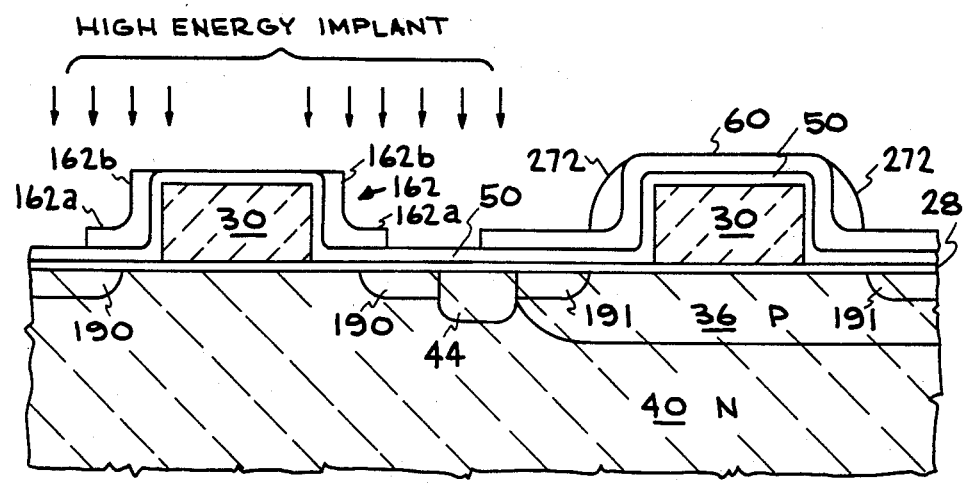

As shown in FIG. 15, spacers 172 are then removed and the P channel region is implanted with a high energy P− implant as in the embodiment described and illustrated previously in FIG. 7. The implantation penetrates through the horizontal portions 162a of el-shaped shielding members 162, as well as the underlying oxide layer 50, to form the LDD N− regions 190 in substrate 40. However, unlike the prior embodiment, wherein photoresist 80 is retained over the N channel region during the P channel implantations, the high energy P− implantation will also penetrate through the unpatterned portion of nitride layer 60 in the N channel region forming P− doped regions 191 therein. However, the P− implantation will not penetrate the portion of the substrate wherein the LDD N− regions will be subsequently formed since these areas are protected by spacers 272. The P− doped areas 191 in the N channel will be subsequently N+ doped so that the small amount of P− dopant formed in areas 191 at this point will not effect the subsequent formation of the N channel.

Figure 16:
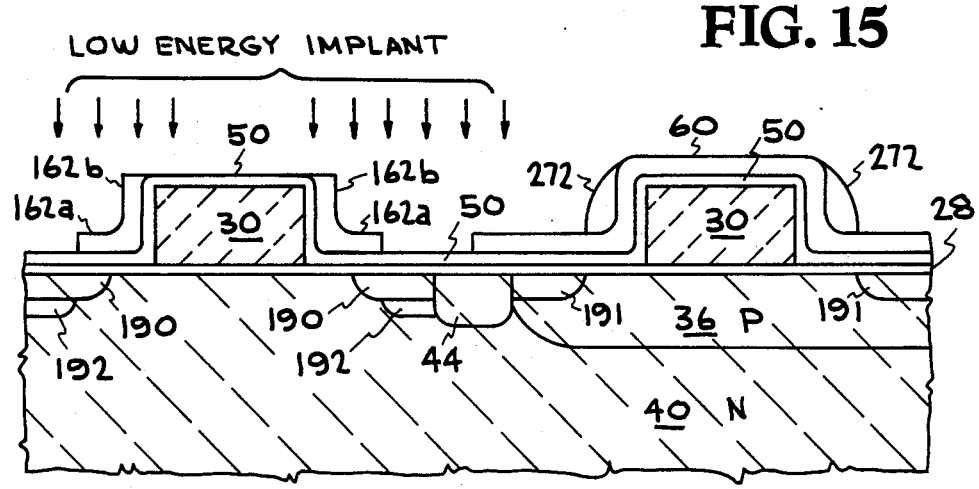

The structure is then implanted with a low energy P+ dopant similar to the previous embodiment of form N+ source and drain regions 192 as shown in FIG. 16. Again as in the embodiment described with respect to FIGS. 3–11, the horizontal portion 162a of el-shaped shielding members 162 prevents the P+ implantation from penetrating to the previously implanted LDD regions 190, while the vertical portions 162b of members 162 prevent penetration by either implantation to provide an initial spacing between the LDD regions 190 and the channel region in substrate 40 beneath gate electrode 30.

Figure 17:
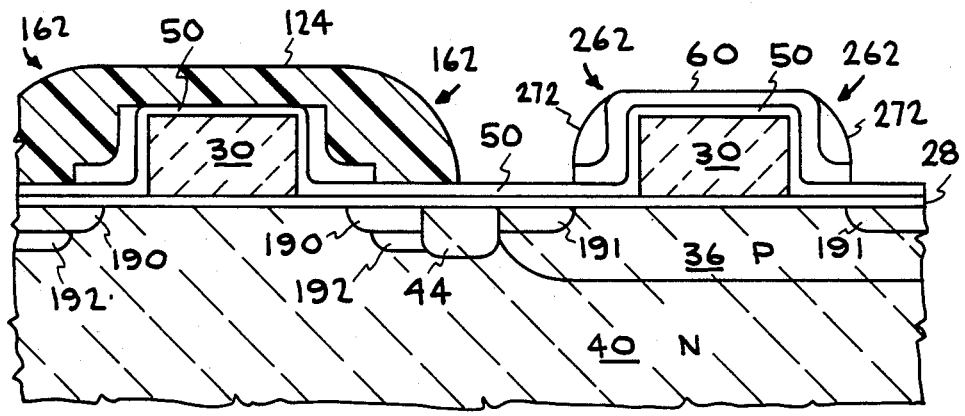
Figure 18:
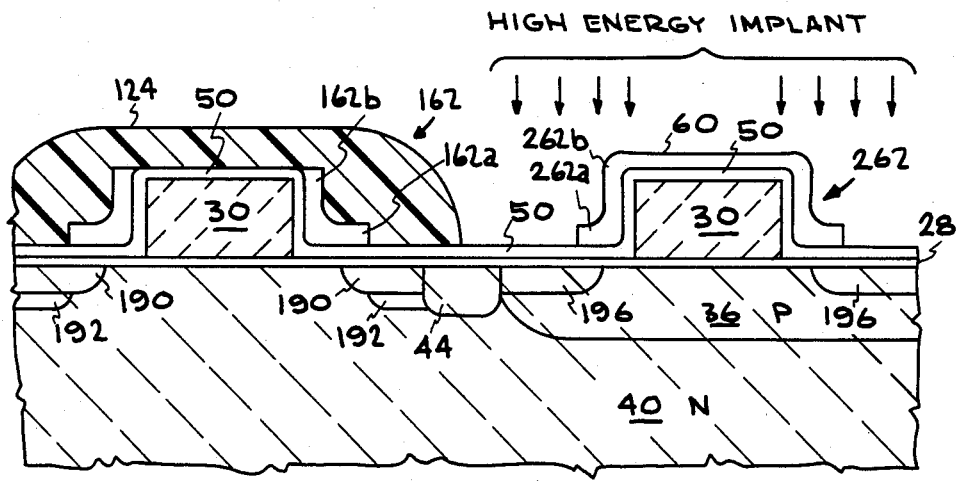

After completion of the formation of the P channel regions, the area is masked with a photoresist mask 124 following which nitride layer 60 over the N channel region is selectively etched using spacers 272 as masks to form el-shaped shielding members 262 as shown in FIG. 17. Spacers 272 are then removed and the N channel region is given a high energy N− implantation which penetrates horizontal portions 262a of el-shaped shield members 262, and oxide layer 50 thereunder, to form LDD N− regions 196 in P well 36 as shown in FIG. 18.

Figure 19:
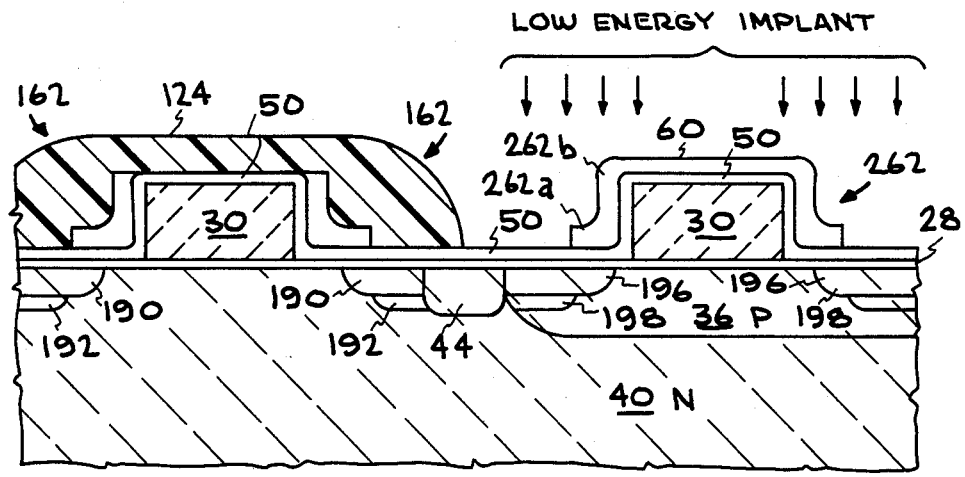

FIG. 19 shows the N channel region subjected to a low energy N+ implantation which does not penetrate nitride portion 262a and the underlying oxide layer 50 but forms N+ regions 198 adjacent the previously formed LDD N— regions 196.

Figure 20:
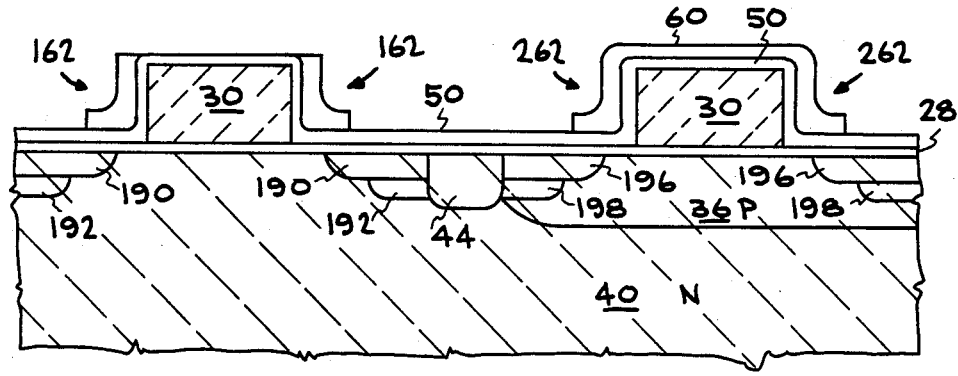
Figure 21:
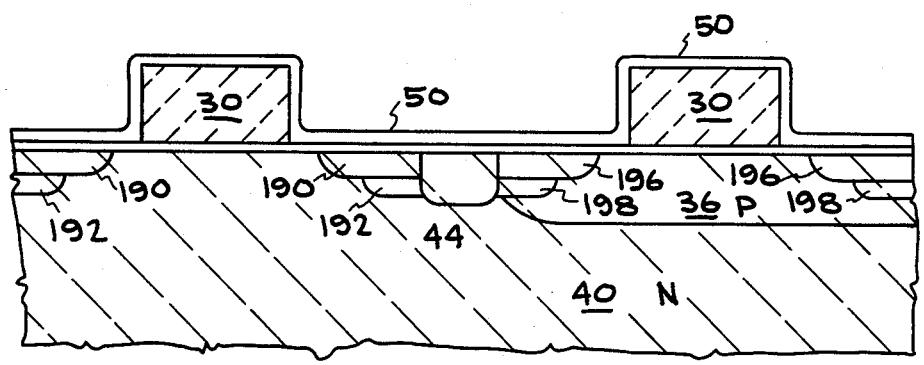

Following the N implantations, photoresist mask 124 is stripped as shown in FIG. 20 and then el-shaped shielding members 162 and 172 may all be stripped off at the same time leaving the structure shown in FIG. 21 which then may be conventionally processed as previously described to form the final structure such as shown in FIG. 11.

While there is no savings in the number of photoresist masks used in this embodiment compared to previous embodiments, the resist mask used to mask the nitride layer over the second channel region during etching of the nitride over the first channel region may be removed before forming the first channel region, thereby permitting the use of higher beam currents during implantation. Thus, only one photoresist mask will be present on the structure during the formation of the two channels.

It should be noted, in this embodiment, that even the high energy implantation of the initially formed P channel will not penetrate into the subsequently formed LDD regions of the N channel since the oxide or polysilicon spacers 272 over the nitride layer in these regions will mask out any of the P+ dopant. With respect to possible penetration of the P— implantation through nitride layer 60 to the portion of the substrate where the N+ source and drain contact regions of the N channel will be formed, this should be of little consequence since the high energy P— implantation is of low concentration and these N+ source and drain contact regions will subsequently be highly doped by the low energy, high concentration N+ implantation during the formation of the N channel.

It should also be noted that in this embodiment, it may only be desired or necessary to construct the P channel or the N channel but not both with LDD regions. In such a case, for example when the P channel is constructed first, after masking the P channel, the spacers 272 could be removed prior to etching of the nitride layer so that the subsequent nitride etch removes all the remaining nitride in the N channel region to permit construction of a regular MOS device without LDD regions. Thus, either a P channel or an N channel device with LDD regions could be constructed followed by construction of a regular device. Such a procedure may be useful, for example, in constructing EPROMs or standard CMOS devices on a chip.

Thus, the invention provides an improved method of forming LDD regions in MOS devices which permit the use of such devices in VSLI structures while eliminating the problems of short channel and punchthrough voltage. The process further solves these problems without creating further processing problems as experienced in the prior art use of polysilicon or oxide spacers to shield the substrate from the N+ and P+ implantations to form the desired lightly doped source and drain regions.

Having thus described the invention, what is claimed is:

1. A method for making an MOS structure having a lightly doped drain region to avoid short channel and punchthrough problems which comprises:
    (a) forming a gate electrode on a substrate;
    (b) forming a shielding layer of an insulating material over the gate electrode and substrate;
    (c) forming another layer of a dissimilar material over said shielding layer;
    (d) anisotropically etching said layer of dissimilar material over said shielding layer to remove said layer except for spacer portions over said shielding layer adjacent the sidewalls of said gate electrode;
    (e) removing the portions of said shielding layer not masked by said spacer portions, leaving one or more el-shaped shielding members each having a vertical portion against said gate electrode and a horizontal leg beneath said spacer portion extending over said substrate from said vertical portion;
    (f) removing said spacer portion over said el-shaped shielding member;
    (g) then implanting said substrate with a dopant material at a sufficiently low energy to prevent penetration of said dopant through said el-shaped shielding member and a concentration high enough to form a highly doped source/drain region in the portion of the substrate not shielded by said el-shaped shielding member or said gate electrode; and
    (h) then implanting said substrate with a dopant material of the same type at a sufficiently high energy to penetrate through said el-shaped shielding member at a concentration low enough to form a lightly doped source/drain region in the portion of the substrate shielded by said el-shaped shielding member adjacent the region of said substrate beneath said gate electrode;
    whereby said low concentration implantation will form a lightly doped source/drain region separating the channel region of the substrate beneath said gate electrode from said highly doped source/drain region.

2. The method of claim 1 wherein said step of forming a shielding layer over said gate electrode and said substrate further comprises first forming an oxide layer over said gate electrode and said substrate, said oxide layer having a thickness, over said substrate, of about 200–300 Angstroms, and then form said shielding layer over said oxide layer.

3. A method for making an MOS structure having a lightly doped drain region to avoid short channel and punchthrough problems which comprises:
    (a) forming one or more gate electrodes on a substrate;
    (b) forming an oxide layer over said substrate and said gate electrode having a thickness, over said substrate, of about 200–300 Angstroms;
    (c) forming a nitride shielding layer over said oxide layer on said gate electrode and substrate;
    (d) forming a conformal third layer of a material selected from the class consisting of silicon oxide and polysilicon over said shielding layer;
    (e) anisotropically etching said third layer to remove said layer except for spacer portions over said nitride shielding layer adjacent the sidewalls of said gate electrode;
    (f) removing the portions of said nitride shielding layer not masked by said spacer portions, using said spacer portions as masks, to thereby form one or more el-shaped nitride shielding members each having a vertical portion against said gate elelctrode and a horizontal leg extending over said oxide layer and said substrate from said vertical portion;
    (g) removing said spacer portion over said el-shaped nitride shielding member;
    (h) implanting said substrate in a first implantation step, after removal of said spacer portion, with a dopant material at a sufficiently low energy to prevent penetration of said dopant through said el-shaped nitride shielding member and a concentration high enough to form an N+ or P+ source/drain region in the portion of said substrate not shielded by said el-shaped nitride shielding member or said gate electrode;

(i) implanting said substrate, in a second implantation step, with a dopant material of the same type as previously implanted in said first implantation step, at a sufficiently high energy to penetrate through said el-shaped shielding member and at a concentration low enough to form an N− or P− region in the portion of the substrate shielded by said el-shaped shielding member adjacent the region of said substrate beneath said gate electrode; and (j) annealing said substrate sufficiently to repair damage done to said substrate by said implantations; whereby said P− or N− implantation will form a lightly doped source/drain region separating the channel region of the substrate beneath said gate electrode from said P+ or N+ source/drain region.

4. The method of claim 3 including the further steps of masking said MOS device formed on said substrate and then forming a second MOS device of opposite conductivity type by repeating said high energy and low energy implantation steps in another portion of said substrate containing another of said gate electrodes using one or more dopants of opposite conductivity type to the dopants used to form the first MOS device and using said el-shaped shielding members to form LDD regions in said second MOS devices.

5. The method of claim 3 wherein said annealing step laterally diffuses said lightly doped source and drain regions toward said channel region under said gate electrode and said process further comprises controlling the thickness of said nitride shielding layer to provide a width of said vertical portion of said el-shaped shielding member approximately equal to the lateral diffusion of said lightly doped source and drain regions whereby said vertical leg will shield the portion of said substrate during said high energy implantation step into which said lightly doped region will laterally diffuse, whereby said lateral diffusion will not extend into the channel region beneath said gate electrode.

6. The method of claim 3 wherein said step of forming a conformal third layer comprises forming an oxide layer doped with a dopant which permits selective etching of said oxide layer at a rate faster than the etch rate of undoped oxide portions associated with said MOS structure.

7. The method of claim 6 wherein said doped oxide layer comprises a silicon oxide material doped with phosphorus.

8. The method of claim 7 wherein said step of removing said spacer portion formed from said doped oxide layer further comprising etching said oxide spacer with a selective wet buffered oxide etch which will remove doped oxide at a rate faster than the etch rate of undoped oxide.

9. A method for making NMOS and PMOS structures having lightly doped drain regions to avoid short channel and punchthrough problems in an integrated circuit structure which comprises:

(a) forming two or more gate electrodes on a substrate;

(b) forming an oxide layer over said substrate and said gate electrodes having a thickness, over said substrate, of about 200–300 Angstroms;

(c) forming a nitride shielding layer over said oxide layer on said gate electrodes and substrate;

(d) forming a conformal third layer of a material selected from the class consisting of silicon oxide and polysilicon over said shielding layer;

(e) anisotropically etching said third layer to remove said layer except for spacer portions over said nitride shielding layer adjacent the sidewalls of said gate electrodes;

(f) removing the portions of said nitride shielding layer not masked by said spacer portions, using said spacer portions as masks, to thereby form one or more el-shaped nitride shielding members each having a vertical portion against each of said gate electrodes and a horizontal leg extending over said oxide layer and said substrate from said vertical portion;

(g) removing said spacer portion over said el-shaped nitride shielding member;

(h) forming a mask over a portion of said substrate containing one or more of said gate electrodes wherein one or more MOS devices of a second conductivity type will be formed;

(i) implanting the unmasked portion of said substrate in a first implantation step, after removal of said spacer portion, with a dopant material of a first conductivity type at a sufficiently low energy to prevent penetration of said dopant through said el-shaped nitride shielding member and a concentration high enough to form an N+ or P+ source/drain region of said first conductivity type in the portion of said substrate not shielded by said el-shaped nitride shielding member or said gate electrode;

(j) implanting said substrate, in a second implantation step, with a dopant material of the same type as previously implanted, at a sufficiently high energy to penetrate through said el-shaped shielding member and at a concentration low enough to form an N− or P− region in the portion of the substrate shielded by said el-shaped shielding member adjacent the region of said substrate beneath said gate electrode;

(k) unmasking said masked portions of said substrate and masking those portions of said substrate in which said MOS devices of said first conductivity type were formed;

(l) implanting the unmasked portion of said substrate, in a third implantation step, with a dopant material of a second conductivity type at a sufficiently low energy to prevent penetration of said dopant through said el-shaped nitride shielding member and a concentration high enough to form an N+ or P+ source/drain region of said second conductivity type in the unmasked portion of said substrate not shielded by said el-shaped nitride shielding member or said gate electrode;

(m) implanting said substrate, in a fourth implantation step, with a dopant material of the same conductivity type as previously implanted in said third implantation step, at a sufficiently high energy to penetrate through said el-shaped shielding member and at a concentration low enough to form an N− or P− region in the portion of the substrate shielded by said el-shaped shielding member adjacent the region of said substrate beneath said gate electrode;

(n) unmasking said masked portions of said substrate;

(o) removing said el-shaped nitride shielding members; and (p) annealing said substrate sufficiently to repair damage done to said substrate by said implantations;

whereby said respective P− or N− implantations of said first and second conductivity types will respectively form lightly doped source/drain regions separating the respective channel regions of said PMOS and NMOS devices in said substrate beneath said gate electrodes from said respective P+ or N+ source/drain regions.

10. A method for making an MOS structure having a lightly doped drain region to avoid short channel and punch-through problems which comprises:

(a) forming a gate electrode on a substrate;

(b) forming an oxide layer over said gate electrode and said substrate to a thickness of about 200–300 Angstroms over said substrate;

(c) forming a shielding layer of an insulating material over said oxide layer and said underlying gate electrode and substrate;

(d) forming another layer of a dissimilar material over said shielding layer;

(e) anisotropically etching said layer of dissimilar material over said shielding layer to remove said layer except for spacer portions over said shielding layer adjacent the sidewalls of said gate electrode;

(f) removing the portions of said shielding layer not masked by said spacer portions, leaving one or more el-shaped shielding members each having a vertical portion against said gate electrode and a horizontal leg beneath said spacer portion extending over said substrate from said vertical portion;

(g) removing said spacer portions over said el-shaped shielding members;

(h) after removing said spacer portions, implanting said substrate in a first implantation step with a dopant material at a sufficiently low energy to prevent penetration of said dopant through said el-shaped shielding members and a concentration high enough to form highly doped source/drain regions in the portion of the substrate not shielded by said el-shaped shielding members or said gate electrode; and (i) implanting said substrate in a second implantation step with a dopant material of the same type as in said first implantation step but at sufficiently high energy to penetrate through said el-shaped shielding members and at a concentration low enough to form lightly doped source/drain regions in the portions of said substrate shielded by said el-shaped shielding members adjacent the region of said substrate beneath said gate electrode;

whereby said low concentration implantation will form lightly doped source/drain regions separating the channel region of said substrate beneath said gate electrode from said highly doped source/drain regions.

11. The method of claim 10 wherein said steps of anisotropically etching said layer of dissimilar material to remove said layer except for spacer portions over said shielding layer adjacent the sidewalls of said shielding layer not masked by said spacer portions, further comprises reactive ion etching both said layer of dissimilar material and said shielding layer stopping on said underlying oxide layer to form said el-shaped shielding members.

12. The method of claim 10 wherein said steps of anisotropically etching said layer of dissimilar material to remove said layer except for spacer portions over said shielding layer adjacent the sidewalls of said gate electrode and removing the portions of said shielding layer not masked by said spacer portions, further comprise reactive ion etching said layer of dissimilar material stopping on said underlying shielding layer and then selectively etching said shielding layer, using said spacer portions as a mask, to form said el-shaped shielding members over said oxide layer and said substrate.

13. The method of claim 10 wherein said step of forming said shielding layer further comprises forming a layer of nitride over said layer of oxide formed over said substrate and said gate electrode.

14. The method of claim 13 wherein said step of forming said layer of dissimilar material over said nitride shielding layer further comprises forming a layer over said shielding layer selected from the class consisting of polysilicon and silicon oxide.

15. The method of claim 14 including the further step of selectively masking said shielding layer over said other portion of said substrate where said second MOS device is to be formed to selectively remove said shielding layer and form said el-shaped shielding members only in the portion of said substrate wherein said first MOS device will be formed with the remainder of said shielding layer functioning as a mask to protect the remainder of said substrate during said implantations to form said first MOS device; and then, after masking said first MOS device, selectively etching said remaining shielding layer to form said el-shaped shielding members adjacent said gate electrode in the region of said substrate wherein said second MOS device will be formed.

16. The method of claim 15 wherein said portion of said substrate having said shielding layer thereon wherein said second MOS will be subsequently formed also has said spacer portions thereon to protect the underlying region of said second MOS device during the steps of implanting the substrate to form said first MOS device, 17. The method of claim 10 wherein said step of forming a gate electrode over said substrate further includes forming a plurality of gate electrodes on said substrate to permit the formation of both N channel and P channel MOS devices thereon and said method includes the further steps of masking the first MOS device formed on said substrate and then forming a second MOS device of opposite conductivity type by forming said spacer portions and said el-shaped shielding members adjacent the gate electrode of said second MOS device in another portion of said substrate and then, after removing said spacer portions, repeating said high energy and low energy implantation steps using one or more dopants of opposite conductivity type to the dopants used to form the first MOS device.

18. The method of claim 17 wherein said steps of forming said spacer portions and said el-shaped shielding members adjacent the gate electrode of said second MOS device in another portion of said substrate are performed prior to said implantation steps to form said first MOS device with LDD regions.

19. The method of claim 18 including the further step of masking the region wherein said second MOS device will be formed after forming said spacers and said el-shaped shielding members and prior to said implantation steps to form said first MOS device.

20. A method for making an MOS structure having a lightly doped drain region to avoid short channel and punchthrough problems which comprises:
(a) forming a gate electrode on a substrate;
(b) forming a shielding layer of an insulating material over the gate electrode and substrate;
(c) forming another layer of a dissimilar material over said shielding layer.
(d) anisotropically etching said layer of dissimilar material over said shielding layer to remove said layer except for spacer portions over said shielding layer adjacent the sidewalls of said gate electrode;
(e) removing the portions of said shielding layer not masked by said spacer portions, leaving one or more el-shaped shielding members each having a vertical portion against said gate electrode and a horizontal leg beneath said spacer portion extending over said substrate from said vertical portion;
(f) removing said spacer portion over said el-shaped shielding member;
(g) then implanting said substrate with a dopant material at a sufficiently high energy to penetrate through said el-shaped shielding member at a concentration low enough to form a lightly doped source/drain region in the portion of the substrate shielded by said el-shaped shielding member adjacent the region of said substrate beneath said gate electrode; and
(h) then implanting said substrate with a dopant material of the same type at a sufficiently low energy to prevent penetration of said dopant through said el-shaped shielding member and a concentration high enough to form a highly doped source/drain region in the portion of the substrate not shielded by said el-shaped shielding member or said gate electrode; whereby said low concentration implantation will form a lightly doped source/drain region separating the channel region of the substrate beneath said gate electrode from said highly doped source/drain region.

* * * * *